US011125830B2

(12) United States Patent
Naito et al.

(10) Patent No.: US 11,125,830 B2
(45) Date of Patent: Sep. 21, 2021

(54) MOTOR DRIVING DEVICE AND DETECTION METHOD FOR DETECTING MALFUNCTION IN HEAT RADIATION PERFORMANCE OF HEATSINK

(71) Applicant: FANUC CORPORATION, Yamanashi (JP)

(72) Inventors: Genzo Naito, Yamanashi (JP); Kazuhiro Yamamoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 212 days.

(21) Appl. No.: 16/549,207

(22) Filed: Aug. 23, 2019

(65) Prior Publication Data

US 2019/0377031 A1 Dec. 12, 2019

Related U.S. Application Data

(62) Division of application No. 15/213,631, filed on Jul. 19, 2016, now abandoned.

(30) Foreign Application Priority Data

Jul. 21, 2015 (JP) .................................. 2015-144124

(51) Int. Cl.
*G01R 31/40* (2020.01)
*F28F 27/00* (2006.01)
(Continued)

(52) U.S. Cl.
CPC ............... *G01R 31/40* (2013.01); *F28F 3/02* (2013.01); *F28F 27/00* (2013.01);
(Continued)

(58) Field of Classification Search
CPC ................................................... G01R 31/40
See application file for complete search history.

(56) References Cited

U.S. PATENT DOCUMENTS

2011/0080124 A1* 4/2011 Sasaki et al. ............... 318/400.3
2015/0305197 A1 10/2015 King
2015/0330924 A1 11/2015 Budde

FOREIGN PATENT DOCUMENTS

CN 104755340 A 7/2015
JP 20054675 A 1/2005
(Continued)

OTHER PUBLICATIONS

English Abstract and Machine Translation for Japanese Publication No. 2014-233194 A, published Dec. 11, 2014, 31 pgs.
(Continued)

*Primary Examiner* — John E Breene
*Assistant Examiner* — Jeffrey C Morgan
(74) *Attorney, Agent, or Firm* — Fredrikson & Byron, P.A.

(57) ABSTRACT

A motor driving device capable of reliably detecting a malfunction in the performance of a heatsink. The motor driving device includes a heat generating element, a heatsink, an electric power detecting part for detecting a consumed power of the heat generating element, a temperature detecting part for detecting a temperature of the motor driving device, a temperature change calculating part for calculating, as a detected valuation, an amount of change in the temperature within a predetermined time, a reference determination part for determining a reference amount of change in the temperature based on the temperature and the consumed power, and a temperature change judging part for comparing the reference amount of change with the detected amount of change, and judges whether the detected change is different from the reference change.

3 Claims, 11 Drawing Sheets

(51) Int. Cl.
   *F28F 3/02*      (2006.01)
   *H05K 7/20*      (2006.01)
(52) U.S. Cl.
   CPC ..... *H05K 7/20909* (2013.01); *H05K 7/20945* (2013.01); *F28F 2200/00* (2013.01)

(56)         References Cited

FOREIGN PATENT DOCUMENTS

| JP | 2008172938 A | 7/2008 |
| JP | 2009130223 A | 6/2009 |
| JP | 2010136609 A | 6/2010 |
| JP | 2012115081 A | 6/2012 |
| JP | 2014233194 A | 12/2014 |

OTHER PUBLICATIONS

English Abstract and Machine Translation for Japanese Publication No. 2012-115081 A, published Aug. 14, 2012, 20 pgs.
English Abstract and Machine Translation for Japanese Publication No. 2010-136609 A, published Jun. 17, 2010, 12 pgs.
English Abstract and Machine Translation for Japanese Publication No. 2008-172938 A, published Jun. 24, 2008, 9 pgs.
English Abstract and Machine Translation for Japanese Publication No. 2005-004675 A, published Jan. 6, 2005, 14 pgs.
English Abstract and Machine Translation for Japanese Publication No. 2009-130223 A, published Jun. 11, 2009, 7 pgs.
English Abstract and Machine Translation for Chinese Publication No. 104755340 A, published Jul. 1, 2015, 10 pgs.

* cited by examiner

MOTOR DRIVING DEVICE AND DETECTION METHOD FOR DETECTING MALFUNCTION IN HEAT RADIATION PERFORMANCE OF HEATSINK

RELATED APPLICATIONS

This is a division of application Ser. No. 15/213,631, filed Jul. 19, 2016, which claims priority to Japanese Application No. 2015-144124, filed Jul. 21, 2015, the teachings of which are incorporated herein by reference.

BACKGROUND OF THE INVENTION

1. Field of the Invention

The invention relates to a motor driving device for detecting abnormalities in the heat radiation performance of a heatsink, and a detection method.

2. Description of the Related Art

In order to cool an electronic device provided with a heat generating element, such as a power element, a heatsink and a fan for generating an air flow in the heatsink are attached to the electronic device. It has been known that, in such an electronic device, the thermal resistance of the heatsink is calculated from the temperature of the electronic device, and abnormalities in the performance of the heatsink are detected (see, for example, Japanese Unexamined Patent Publication (Kokai) No. 2009-130223).

A motor driving device for driving a motor embedded in, for example, a machine tool can control electric power to be supplied to the motor so that the electric power greatly varies in a short period of time. In this instance, the temperature of the motor driving device greatly varies in a short period of time.

In order to calculate the thermal resistance with high precision in the above conventional technology, the temperature of the electronic device should be detected when remaining in a steady state. Thus, in a conventional method, it is difficult to accurately detect abnormalities in the performance of the heatsink in the motor driving device in which the temperature greatly varies in a short period of time.

SUMMARY OF THE INVENTION

In an aspect of the invention, a motor driving device includes a heat generating element, a heatsink which cools the heat generating element, an electric power detecting part which detects a consumed power of the heat generating element, a temperature detecting part which detects a temperature of the motor driving device, and a temperature change calculating part which calculates an amount of change in the temperature within a predetermined time as a detected amount of change, based on the temperature detected by the temperature detecting part.

Further, the motor driving device includes a reference determination part which determines a reference amount of change in the temperature based on the temperature detected by the temperature detecting part and the consumed power detected by the electric power detecting part, and a temperature change judging part which compares the reference amount of change determined by the reference determination part with the detected amount of change calculated by the temperature change calculating part, and judges whether the detected amount of change is different from the reference amount of change.

The temperature change judging part may judge that the detected amount of change is different from the reference amount of change when the detected amount of change is out of an allowable range predetermined so as to include the reference amount of change. The temperature change judging part may judge whether the detected amount of change is different from the reference amount of change when the consumed power is zero and the detected amount of change is a negative value.

The motor driving device may include a fan which generates an air flow in the heatsink, a rotation number detecting part which detects a rotation number of the fan, and a rotation number judging part which judges whether the rotation number detected by the rotation number detecting part is different from a predetermined reference rotation number of the fan when the temperature change judging part judges that the detected amount of change is different from the reference amount of change.

The motor driving device may further include a malfunction signal generating part which generates a signal indicating that a malfunction occurs in the performance of the heatsink when the temperature change judging part judges that the detected amount of change is different from the reference amount of change.

The malfunction signal generating part may generate a signal indicating that a malfunction occurs in the performance of the heatsink when the temperature change judging part judges that the detected amount of change is different from the reference amount of change and the rotation number judging part judges that the rotation number is not different from the reference rotation number.

The malfunction signal generating part may generate a signal indicating that a malfunction occurs in the operation of the fan when the temperature change judging part judges that the detected amount of change is different from the reference amount of change and the rotation number judging part judges that the rotation number is different from the reference rotation number The motor driving device may further include a steady state judging part which judges whether a temperature change of the motor driving device is in a steady state. The temperature change calculating part may calculate the detected amount of change when the steady state judging part judges that the temperature change of the motor driving device is not in a steady state.

The steady state judging part judges that the temperature change of the motor driving device is in a steady state when the consumed power is constant for a predetermined period of time.

The motor driving device may include a thermal resistance calculating part which calculates a thermal resistance of the motor driving device based on the consumed power and the temperature detected by the temperature detecting part when the steady state judging part judges that the temperature change of the motor driving device is in a steady state.

The motor driving device may further include a thermal resistance judging part which judges whether the thermal resistance calculated by the thermal resistance calculating part is different from a predetermined reference thermal resistance.

In another aspect of the invention, a method of detecting a malfunction in the heat radiation performance of a heatsink provided at a motor driving device includes detecting a consumed power of a heat generating element provided at the motor driving device, detecting a temperature of the motor driving device, and calculating an amount of change in the temperature within a predetermined time as a detected change, based on the detected temperature.

Further, the method includes determining a reference amount of change in the temperature based on the detected consumed power and the detected temperature, and comparing the determined reference amount of change with the calculated detected amount of change, and judging whether the detected amount of change is different from the reference amount of change.

BRIEF DESCRIPTION OF THE DRAWINGS

The aforementioned or other objects, features and advantages of the invention will be clarified in view of the detailed description of exemplary embodiments with reference to the accompanying drawings, in which.

DETAILED DESCRIPTION

Figure 1:
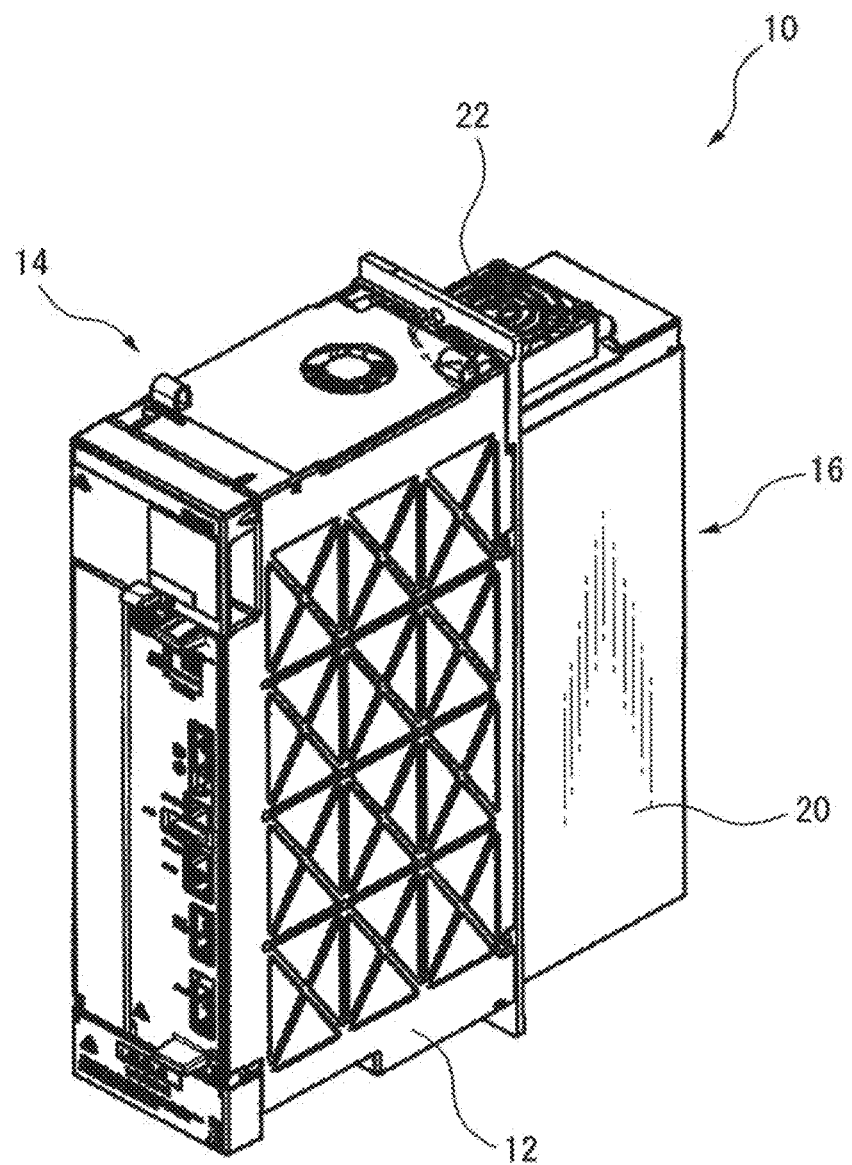
FIG. 1 is a perspective view of a motor driving device according to an embodiment of the invention.

Embodiments of the invention will be described below in detail with reference to the drawings. First, referring to FIGS. 1 to 4, a motor driving device 10 according to an embodiment of the invention will be described. The motor driving device 10 supplies electric power to a main motor (not shown) built in a machine tool, etc., in order to drive the main motor.

The motor driving device 10 includes a housing 12, a controller 14, a heatsink assembly 16, heat generating elements 24, and a temperature detecting part 26. The housing 12 is a box member made of e.g. a resin, and defines an inner space therein.

The controller 14 includes e.g. a CPU, and is mounted in the inner space of the housing 12. The controller 14 directly or indirectly controls each component of the motor driving device 10.

Figure 2:
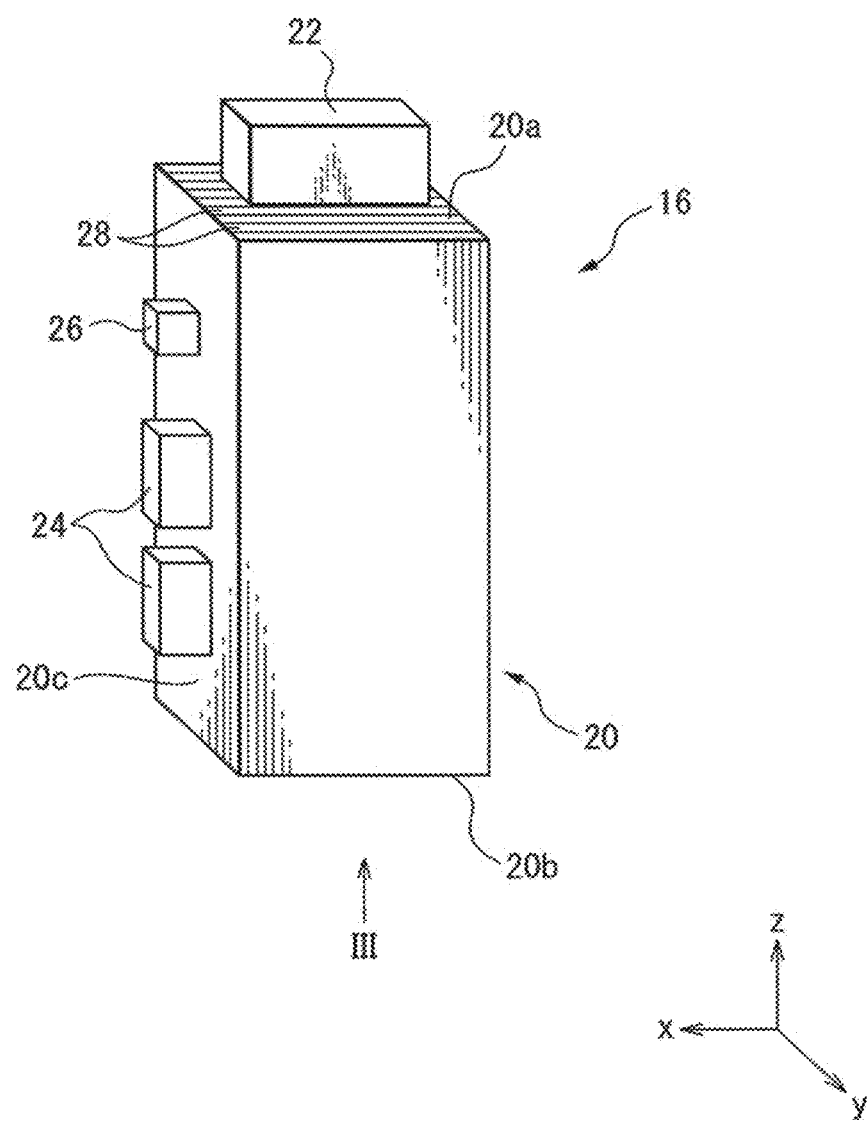
FIG. 2 is a view of a heatsink assembly provided at the motor driving device shown in FIG. 1.
Figure 3:
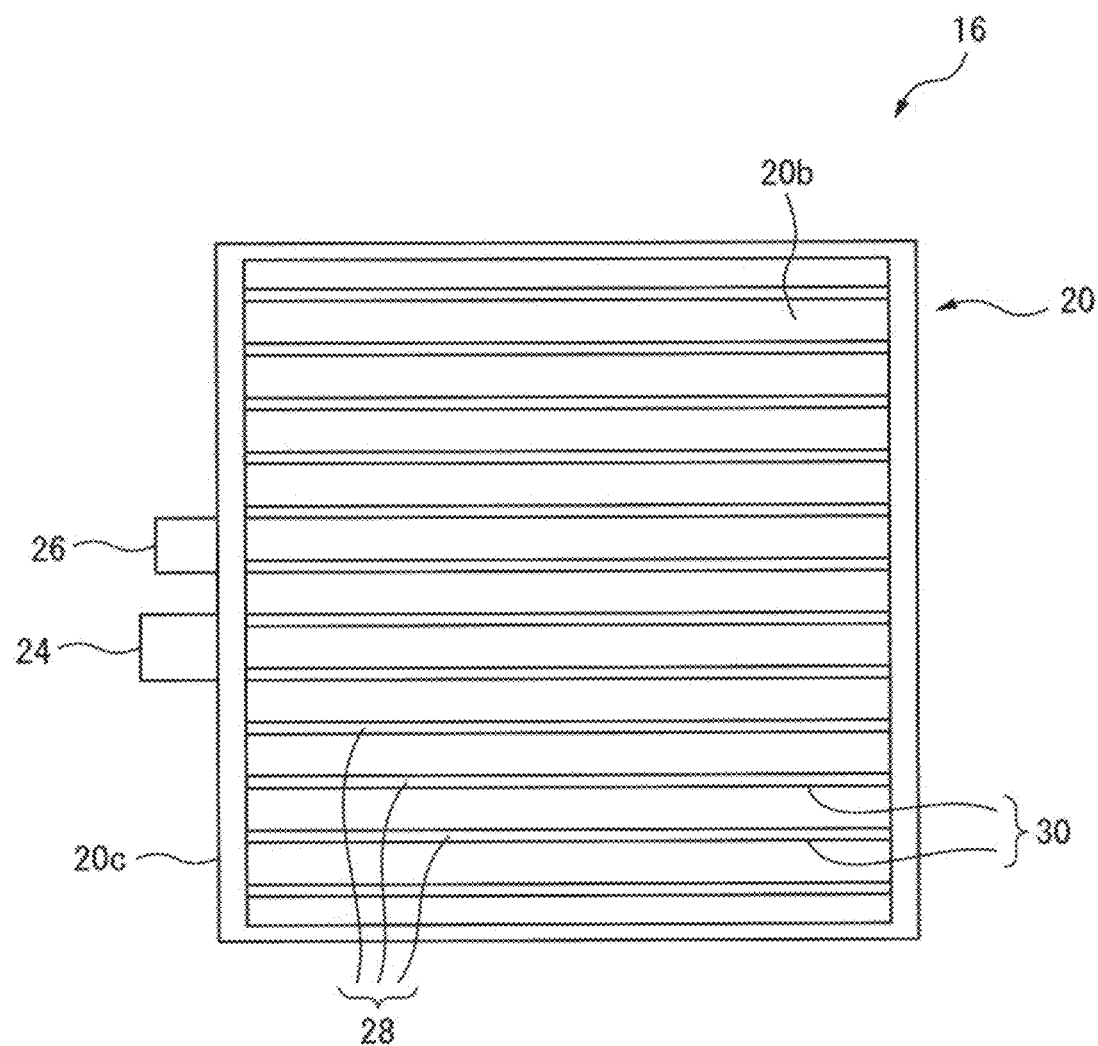
FIG. 3 is a view of the heatsink assembly shown in FIG. 2 as seen from the direction indicated by arrow III in FIG. 2.

The heatsink assembly 16 is provided to be adjacent to the housing 12. As shown in FIGS. 2 and 3, the heatsink assembly 16 includes a heatsink 20 and a fan 22.

The heatsink 20 is a rectangular member having a longitudinal direction along the z-axis direction in the Cartesian coordinate system shown in FIGS. 2 and 3. The heatsink 20 has a first end part 20a in the z-axis direction and a second end part 20b opposite the first end part 20a.

The heatsink 20 includes a plurality of heat radiation fins 28. Each of the heat radiation fins 28 is a plate member having a predetermined length in the z-axis direction, a predetermined thickness in the y-axis direction, and a predetermined width in the x-axis direction. Each of the heat radiation fins 28 extends between the first end part 20a and the second end part 20b. The heat radiation fins 28 are arranged to align in the y-axis direction at substantially equal intervals.

Flow paths 30 are each defined between two heat radiation fins 28 adjacent to each other in the y-axis direction. Each flow path 30 extends in the z-axis direction between the first end part 20a and the second end part 20b, and opens to the outside at the first end part 20a and the second end part 20b.

The fan 22 is attached to the first end part 20a of the heatsink 20. The fan 22 includes a rotator (not shown) with a plurality of vanes, and a fan motor (not shown) which rotates the rotator. The fan motor rotates the rotator of the fan 22 in accordance with a command from the controller 14.

When the rotator of the fan 22 is rotated, an air flow in e.g. the z-axis positive direction in FIG. 2 is generated in the flow paths 30. In this case, outside air is flown into the openings of the flow paths 30 at the second end part 20b, passes through the flow paths 30 in the z-axis positive direction, and is discharged from the openings of the flow paths 30 at the first end part 20a. The heatsink 20 is cooled by the air flowing through the flow paths 30 as described above, thereby the motor driving device 10 is cooled.

In this embodiment, the heat generating elements 24 and the temperature detecting part 26 are disposed on an outer surface 20c of the heatsink 20. The heat generating elements 24 includes e.g. a power element, and generates electric power in accordance with a command from the controller 14. The controller 14 supplies the electric power generated by the heat generating elements 24 to the main motor of e.g. a machine tool so as to drive the main motor.

The temperature detecting part 26 includes a temperature sensor, and detects the temperature at a position at which the temperature detecting part 26 is disposed, in accordance with a command from the controller 14. The temperature detecting part 26 sends data of the detected temperature to the controller 14.

Figure 4:
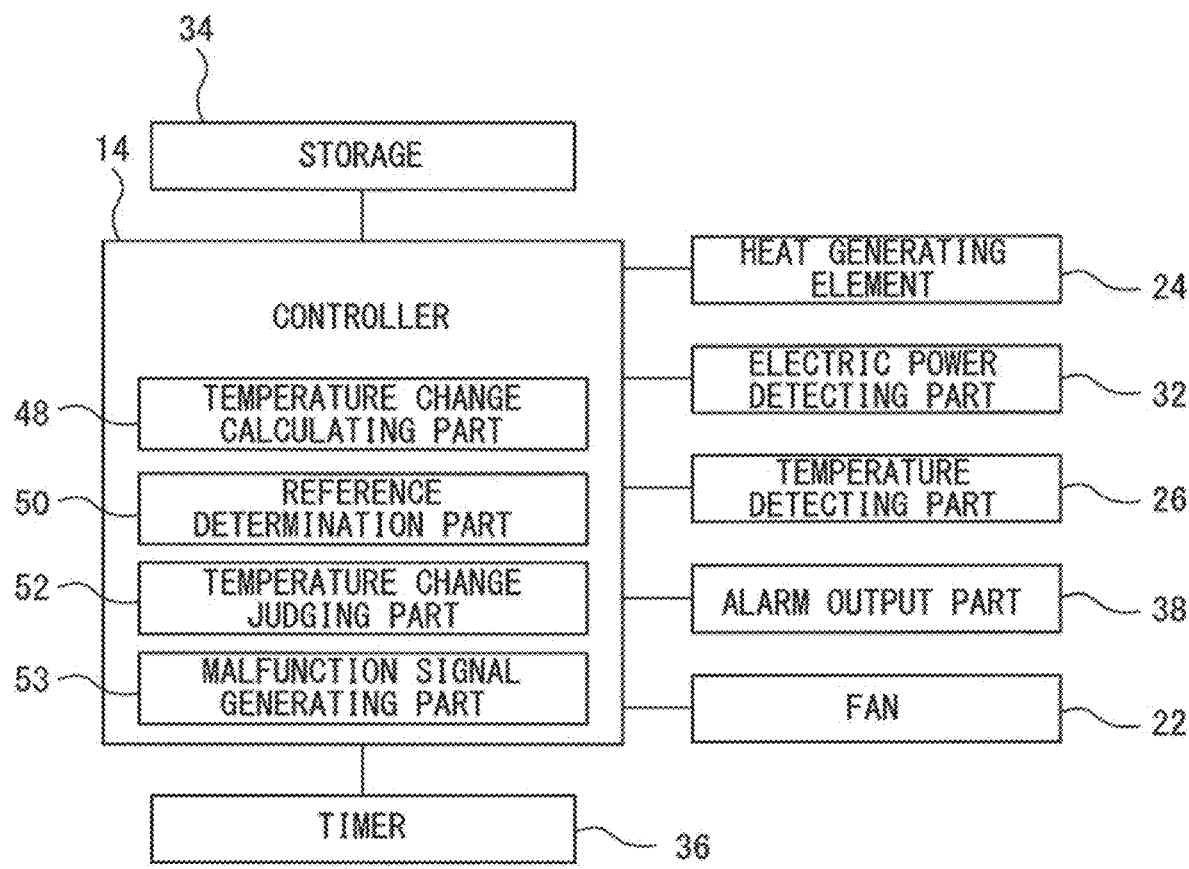
FIG. 4 is a block diagram of the motor driving device shown in FIG. 1.

As shown in FIG. 4, the motor driving device 10 further includes an electric power detecting part 32, a storage 34, a timer 36, and an alarm output part 38.

The electric power detecting part 32 detects the consumed power of the heat generating elements 24, and sends data of the detected consumed power to the controller 14. As an example, the electric power detecting part 32 is installed so as to detect the consumed power of one of the heat generating elements 24. As another example, the electric power detecting part 32 may be installed so as to detect the consumed power of the whole of a power amplifier (not shown) comprised of a plurality of heat generating elements 24.

The storage 34 is comprised of e.g. a non-volatile memory which can electrically delete/record data, such as an EEPROM (trademark), or a random access memory which can rapidly read/write data, such as a DRAM, a SRAM, etc.

The storage 34 is connected to the controller 14 so as to communicate with the controller 14, and stores data received from the temperature detecting part 26 and the electric power detecting part 32, and a reference amount of change that will be described later. The storage 34 may be built in the controller 14, or may be built in an external device (e.g., a server) which is installed outside of the controller 14 and which is connected to the controller 14 so as to communicate with the controller 14 via a network.

The timer 36 times an elapsed time from a predetermined time point in accordance with a command from the controller 14. The alarm output part 38 includes e.g. a speaker or display, and outputs a sound wave or an image in accordance with a command from the controller 14. The timer 36 may be built in the controller 14, or in an external device installed outside of the controller 14 so as to be communicably connected to the controller.

As the fan 22 is operated so as to cause an air to flow in the flow paths 30 in order to cool the motor driving device 10, foreign substances, such as dusts, can enter the flow paths 30 and accumulate to block the flow paths 30.

In this case, an air flow in the flow paths 30 is disturbed, thereby the air flow abnormally decreases. Consequently, the heat radiation performance of the heatsink 20 may be reduced to cause the motor driving device 10 to overheat.

The motor driving device 10 according to this embodiment detects whether a malfunction occurs in the heat radiation performance of the heatsink 20, based on an amount of change in the temperature detected by the temperature detecting part 26 with respect to time.

The concept of a method of detecting a malfunction in the heat radiation performance of the heatsink 20 of the motor driving device 10 will be described below with reference to FIGS. 5 and 6. Each of the graphs in the upper sections of FIGS. 5 and 6 shows a relationship between temperature T detected by the temperature detecting part 26 and time t, while each of the graphs in the lower sections of FIGS. 5 and 6 shows a relationship between electric power P detected by the electric power detecting part 32 and time t.

Figure 5:
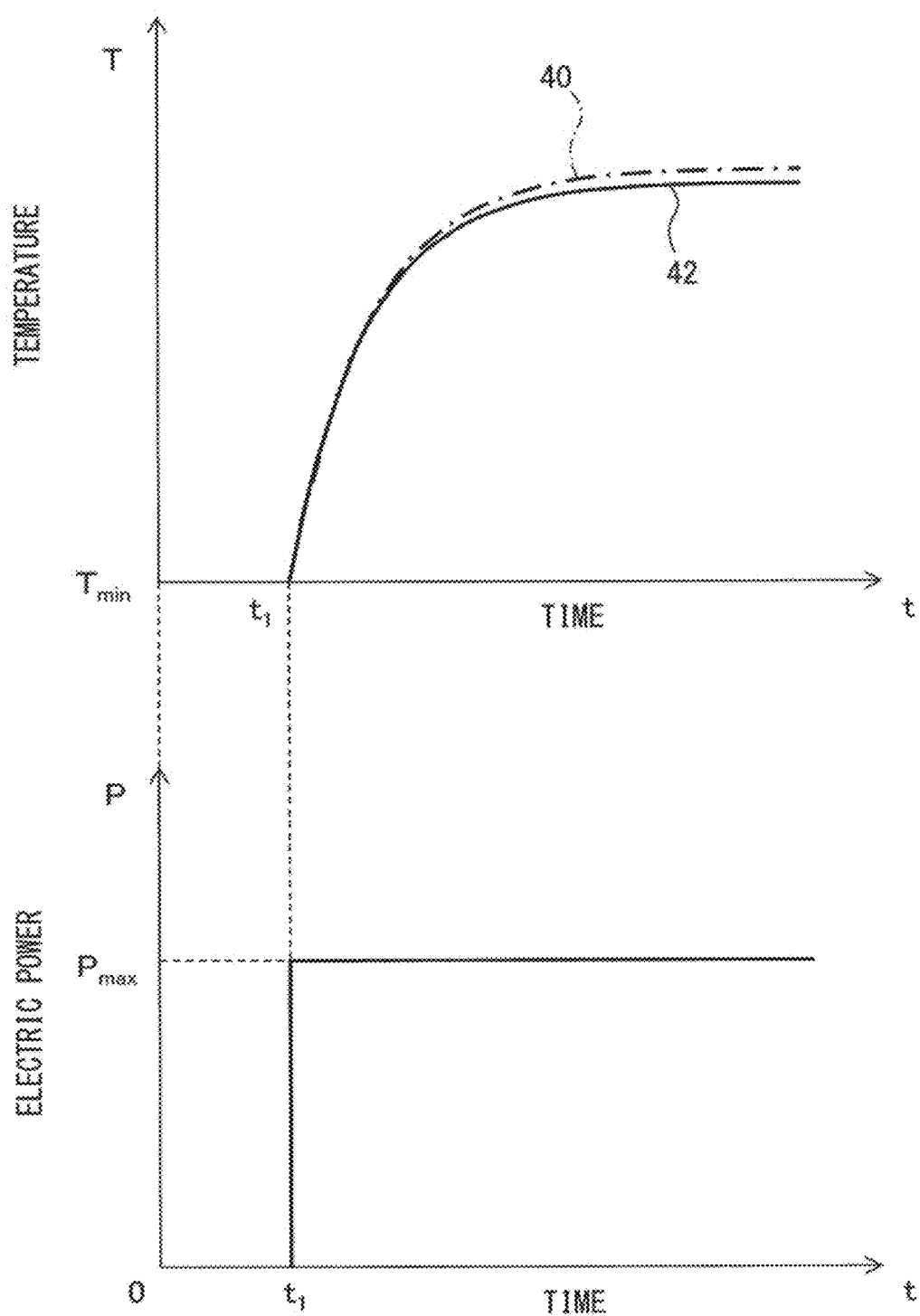
FIG. 5 is a graph showing a relationship between the temperature of the motor driving device and time, and a relationship between the consumed power of the heat generating element and time, wherein the temperature is in a steady state.
Figure 6:
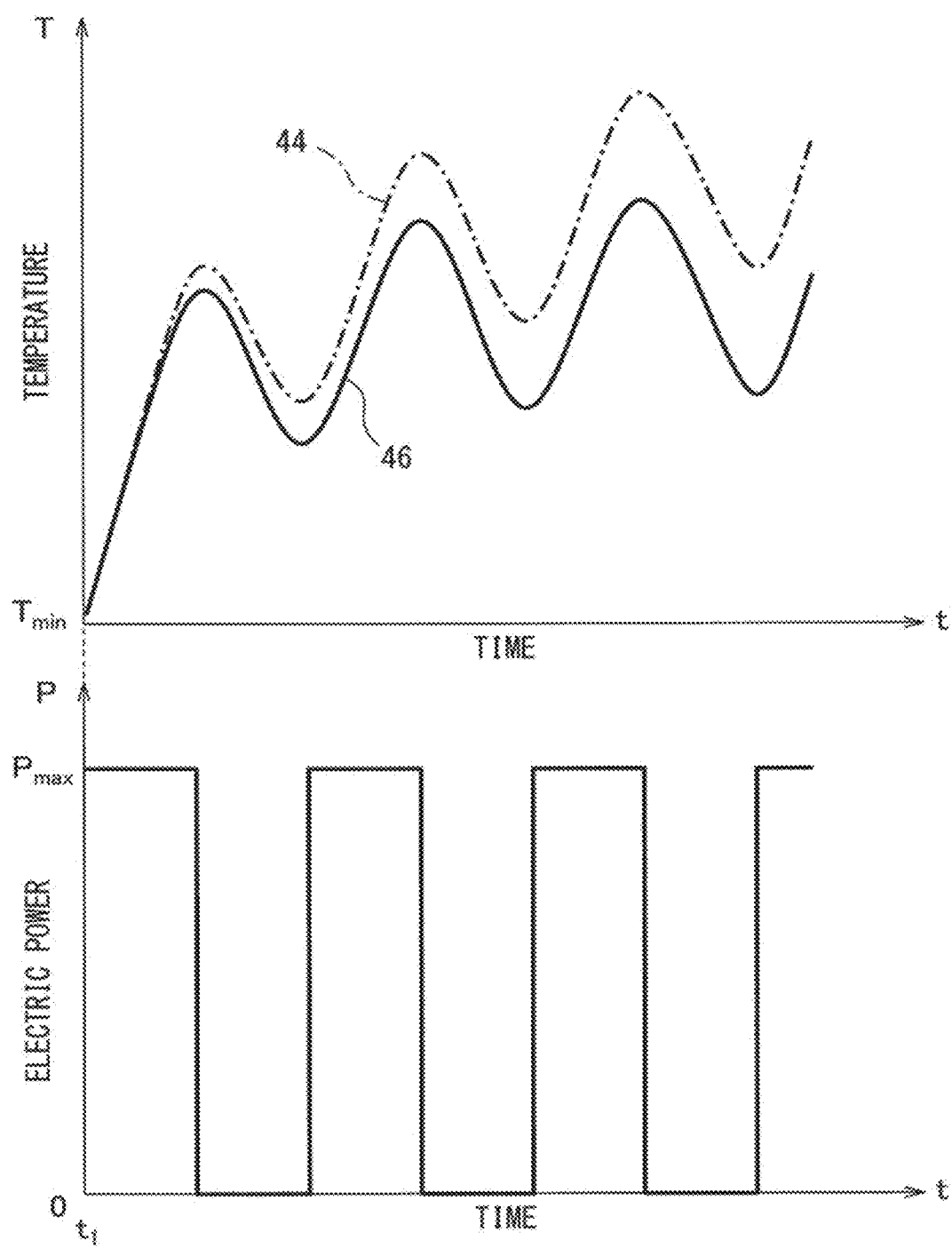
FIG. 6 is a graph showing a relationship between the temperature of the motor driving device and time, and a relationship between the consumed power of the heat generating element and time, wherein the temperature varies in a short period of time.

Note that, each of solid lines 42 and 46 in FIGS. 5 and 6 represents a characteristic in a case where foreign substances do not accumulate in the flow paths 30 of the heatsink 20, and the heat radiation performance of the heatsink 20 is normal (hereinafter referred as "normal product").

On the other hand, each of dashed-dotted lines 40 and 44 in FIGS. 5 and 6 represents a characteristic in a case where foreign substances accumulate in the flow paths 30 of the heatsink 20, thereby an air flow in the flow paths 30 are disturbed so that the heat radiation performance of the heatsink 20 is reduced (hereinafter referred as "malfunction product").

As shown in FIG. 5, when a constant electric power $P_{max}$ is applied to the heat generating elements 24 from a time point $t_1$, the temperature T rapidly increases from the time point $t_1$, and then gradually shifts to a steady state (i.e., saturated state).

When the temperature T is in a steady state, there is no remarkable difference between an amount of temperature change with respect to time (i.e., a gradient) of the characteristic of the normal product (solid line 42) and an amount of temperature change with respect to time of the characteristic of the malfunction product (dashed-dotted line 40). In such a steady state, it is possible to detect a thermal resistance of the motor driving device 10 (e.g., the heatsink 20) accurately, based on the temperature T and the electric power P.

On the other hand, when the electric power P applied to the heat generating elements 24 varies in a short period of time (for example, when the motor driving device 10 supplies a high-frequency electric power to the main motor) as shown in FIG. 6, the temperature T also varies in a short period of time so as to follow the variation of the consumed power P, thereby does not shift to a steady state. In this case, it is not possible to accurately calculate the thermal resistance of the motor driving device 10.

As described above, in the motor driving device 10, the consumed power varies in a short period of time, and therefore the temperature T greatly varies in a short period of time as shown in the upper graph of FIG. 6.

Referring to the upper graph of FIG. 6, when the temperature increases, the degree of increase in the temperature with respect to time of the malfunction product (i.e., dashed-dotted line 44) is larger than that of the normal product (i.e., solid line 46).

On the other hand, when the temperature decreases, the degree of decrease in the temperature with respect to time of the malfunction product (i.e., dashed-dotted line 44) is smaller than that of the normal product (i.e., solid line 46). In other words, the gradient (or time-derivative coefficient) of the characteristic of the malfunction product when the temperature increases and when the temperature decreases is remarkably different from that of the normal product.

The motor driving device 10 according to this embodiment detects whether a malfunction occurs in the heat radiation performance of the heatsink 20 by comparing an amount of change in the temperature with respect to time of the normal product (a reference amount of change) with an amount of change in the temperature detected by the temperature detecting part 26 with respect to time (a detected amount of change).

Figure 7:
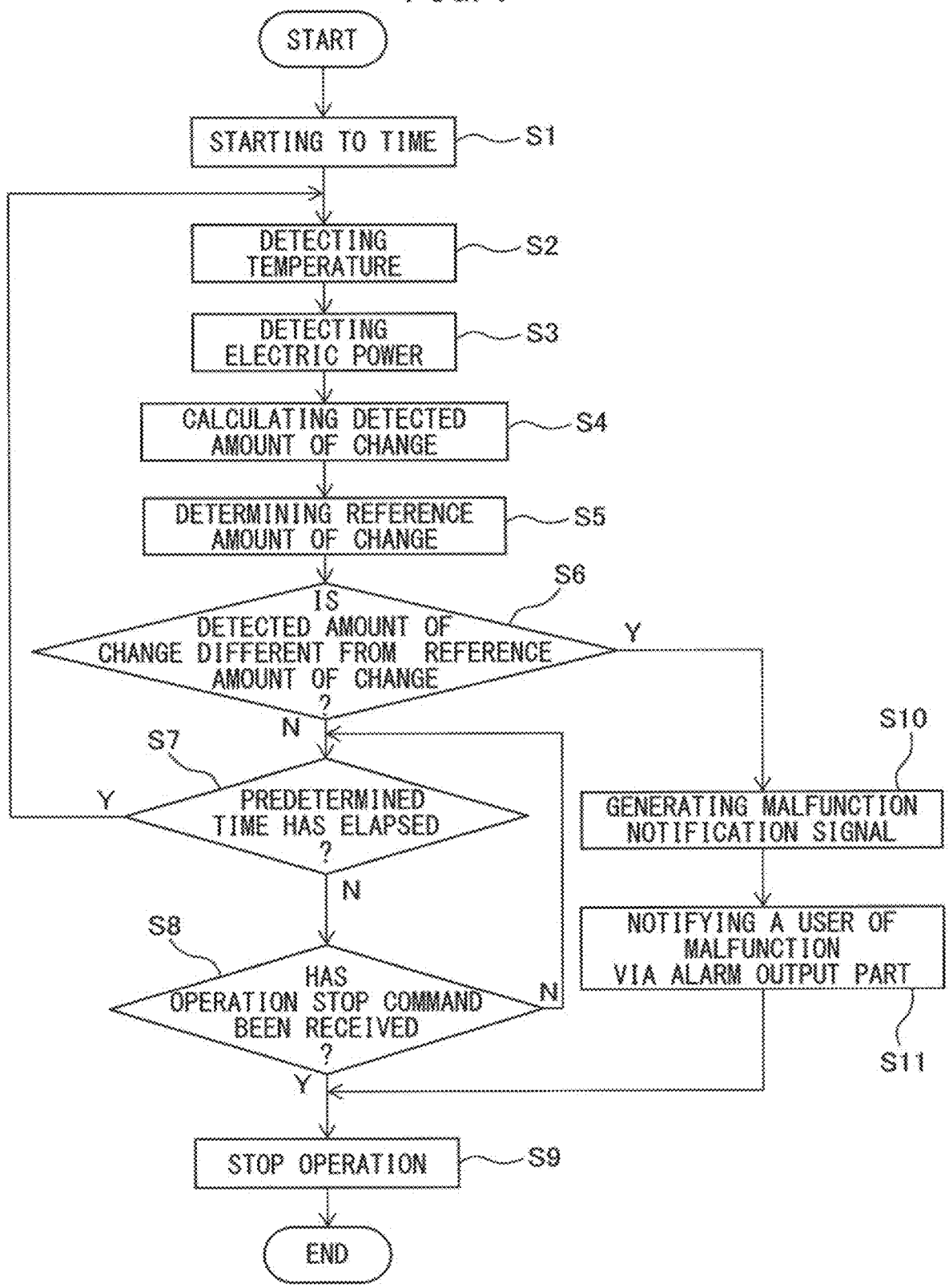
FIG. 7 is a flowchart showing an example of a processing flow of the motor driving device shown in FIG. 4.

Next, the operation of the motor driving device 10 will be described below with reference to FIG. 7. The processing flow shown in FIG. 7 is started when the controller 14 receives a motor drive command for driving the main motor built in a machine tool, etc., from e.g. a user or a host controller (e.g., a machine tool controller).

At step S1, the controller 14 starts to time an elapsed time. Specifically, the controller 14 sends a timing start command to the timer 36. The timer 36 times an elapsed time from the time point when it has received the timing starting command from the controller 14.

As described later, in the processing flow according to this example, the controller 14 repeatedly executes a loop of steps S2 to S7 at a period t (e.g., one second) until it judges "YES" at step S6 or S8. Below, an operation when the controller 14 executes the n-th loop will be described.

At step S2, the controller 14 detects a temperature $T_n$ of the motor driving device 10. Specifically, the controller 14 transmits a command to the temperature detecting part 26 so as to detect a temperature at the position where the temperature detecting part 26 is disposed. The controller 14 records data of the temperature acquired from the temperature detecting part 26 onto the storage 34.

At step S3, the controller 14 detects a consumed power $P_n$ of the heat generating elements 24. Specifically, the controller 14 transmits a command to the electric power detecting part 32 so as to detect a consumed power of the heat generating elements 24. The controller 14 records data of the consumed power acquired from the electric power detecting part 32 onto the storage 34.

At step S4, the controller 14 calculates a detected amount of change which corresponds to an amount of change in the temperature within the time $\tau$ (period $\tau$). As an example, the controller 14 calculates a difference $\Delta T_n$ $(=T_n-T_{n-1})$ between the temperature $T_n$ acquired at step S2 in the n-th loop and the temperature $T_{n-1}$ acquired at step S2 in the (n−1)-th loop (i.e., acquired time t before the temperature $T_n$), as a detected amount of change $\Delta T_n$.

In another example, the controller 14 calculates a gradient $\delta T_n/\delta t$ $(=\Delta T_n/T)$ obtained by dividing the above-mentioned difference $\Delta T_n$ by the time $\tau$, as a detected change $\delta T_n/\delta t$. Thus, in this embodiment, the controller 14 functions as a temperature change calculating part 48 (FIG. 4) which calculates the detected amount of change ($\Delta T_n$, $\delta T_n/\delta t$).

At step S5, the controller 14 determines a reference amount of change $\Delta T_{ref}$ based on the temperature $T_n$ acquired at step S2 and the consumed power $P_n$ acquired at step S3.

The reference amount of change $\Delta T_{ref}$ is a parameter corresponding to a degree of temperature change with respect to time of the normal product (solid line 46) in FIG. 6.

For example, when the difference $\Delta T_n$ is calculated as the detected amount of change at step S4, the reference amount of change $\Delta T_{ref}$ is set as a parameter corresponding to a temperature change within the time t of the characteristic of the normal product in FIG. 6. Alternatively, when the gradient $\delta T_n/\delta t$ is calculated as the detected amount of change at step S4, the reference amount of change $\Delta T_{ref}$ is set as a parameter corresponding to a gradient (time-derivative coefficient) of the characteristic of the normal product in FIG. 6.

As an example, the reference amount of change $\Delta T_{ref}$ is pre-stored in the storage 34 in association with the temperature T and the consumed power P. In this case, at this step S5, the controller 14 reads out from the storage 34 a reference amount of change associated with the temperature $T_n$ acquired at step S2 and the consumed power $P_n$ acquired at step S3, and determines it as the reference amount of change $\Delta T_{ref}$.

In another example, the reference amount of change $\Delta T_{ref}$ is defined as a function of the temperature T and the consumed power P. In this case, at this step S5, the controller 14 calculates the reference amount of change $\Delta T_{ref}$ from the temperature $T_n$ acquired at step S2 and the consumed power $P_n$ acquired at step S3.

Thus, in this embodiment, the controller 14 functions as a reference determination part 50 (FIG. 4) which determines the reference amount of change $\Delta T_{ref}$ based on the temperature $T_n$ detected by the temperature detecting part 26 and the consumed power $P_n$ detected by the electric power detecting part 32.

At step S6, the controller 14 compares the detected amount of change ($\Delta T_n$, $\delta T_n/\delta t$) calculated at step S4 with the reference amount of change $\Delta T_{ref}$ determined at step S5, and judges whether the detected amount of change is different from the reference amount of change $\Delta T_{ref}$.

As an example, the controller 14 calculates a difference $\delta_1$ $(=|\Delta T_n-\Delta T_{ref}|, |\delta T_n/\delta t-\Delta T_{ref}|)$ between the detected amount of change ($\Delta T_n$, $\delta T_n/\delta t$) and the reference amount of change $\Delta T_{ref}$, and judges whether the difference $\delta_1$ exceeds a predetermined threshold value $\alpha_1$.

When the difference $\delta_1$ exceeds the threshold value $\alpha_1$ (i.e., $\delta_1>\alpha_1$), the controller 14 judges that the detected amount of change $\Delta T_n$, $\delta T_n/\delta t$ is different from the reference amount of change $\Delta T_{ref}$ (i.e., judges "YES"), and proceeds to step S10. On the other hand, when the difference $\delta_1$ does not exceed the threshold value $\alpha_1$ (i.e., $\delta_1 \leq \alpha_1$), the controller 14 determines that the detected amount of change is not different from the reference amount of change $\Delta T_{ref}$ (i.e., judges "NO"), and proceeds to step S7.

As another example, the controller 14 judges whether the detected amount of change $\Delta T_n$, $\delta T_n/\delta t$ falls within an allowable range which is predetermined so as to include the reference amount of change $\Delta T_{ref}$ (e.g., within a range of ±5% of the reference amount of change $\Delta T_{ref}$).

When the detected amount of change $\Delta T_n$, $\delta T_n/\delta t$ is out of the allowable range, the controller 14 judges that the detected amount of change is different from the reference amount of change $\Delta T_{ref}$ (i.e., judges "YES"), and proceeds to step S10.

On the other hand, when the detected amount of change $\Delta T_n$, $\delta T_n/\delta t$ falls within the allowable range, the controller 14 judges that the detected amount of change is not different from the reference amount of change $\Delta T_{ref}$ (i.e., judges "NO"), and proceeds to step S7.

Thus, in this embodiment, the controller 14 functions as a temperature change judging part 52 (FIG. 4) which compares the reference amount of change $\Delta T_{ref}$ with the detected amount of change ($\Delta T_n$, $\delta T_n/\delta t$), and judges whether the detected amount of change is different from the reference amount of change.

At step S7, the controller 14 judges whether the elapsed time clocked by the timer 36 has reached $\tau \times n$ ($\tau$: period, n: the number of repetition of the loop). When the controller 14 judges that the elapsed time has reached $\tau \times n$ (i.e., judges "YES"), the controller 14 returns to step S2. On the other hand, when the controller 14 judges that the elapsed time has not reached $\tau \times n$ (i.e., judges "NO"), the controller 14 proceeds to step S8.

At step S8, the controller 14 judges whether it has received a stop command for stopping the operation of the motor driving device 10 from a user or a host controller. When The controller 14 judges that it has received the stop command (i.e., judges "YES"), the controller 14 proceeds to step S9. On the other hand, when the controller 14 judges that it has not received the stop command (i.e., judges "NO"), the controller 14 returns to step S7.

When it is judged "YES" at step S6, at step S10, the controller 14 generates a malfunction notification signal indicating that a malfunction occurs in the heat radiation performance of the heatsink 20. As an example, the controller 14 generates the malfunction notification signal in the form of an audio signal of an alarm for a user.

As another example, the controller 14 generates the malfunction notification signal in the form of an image signal of an alarm visible to a user. Thus, in this embodiment, the controller 14 functions as a malfunction signal generating part 53 (FIG. 4) which generates a signal indicating that a malfunction occurs in the performance of the heatsink 20.

At step S11, the controller 14 notifies a user that a malfunction occurs in the heat radiation performance of the heatsink 20, via the alarm output part 38. As an example, if an audio signal of an alarm is generated at step S10, the controller 14 transmits the audio signal to the alarm output part 38. In this case, the alarm output part 38 includes a speaker and outputs the received audio signal as an alarm sound.

As another example, if an image signal of an alarm is generated at step S10, the controller 14 transmits the image signal to the alarm output part 38. In this case, the alarm output part 38 includes a display and displays an alarm image corresponding to the received image signal.

At step S9, the controller 14 stops the operation of the motor driving device 10. Specifically, the controller 14 stops the supply of electric power to the heat generating elements 24, thereby stops the supply of electric power to the main motor.

As described above, in the processing flow according to this example, the controller 14 repeatedly executes a loop of steps S2 to S7 at the period t until it judges "YES" at step S6 or S8, and calculates the detected amount of change ($\Delta T_n$, $\delta T_n/\delta t$) with respect to the time $\tau$, at intervals of the predetermined time $\tau$.

The controller 14 constantly monitors whether the detected amount of change is different from the reference amount of change $\Delta T_{ref}$. According to this configuration, it is possible to detect a malfunction in the heat radiation performance of the heatsink 20, even if the temperature T of the motor driving device 10 varies in a short period of time as shown in FIG. 6.

Further, in this embodiment, if a malfunction in the heat radiation performance of the heatsink 20 is detected, a user is automatically informed of the malfunction by the alarm output part 38. Accordingly, the user can automatically and reliably recognize that it is necessary to remove foreign substances from the flow paths 30 for maintenance, for example.

Note that, the controller 14 may execute step S6 only when the temperature T of the motor driving device 10 increases or when the temperature T decreases. This configuration will be described below.

As can be seen from the upper graph of FIG. 6, the difference between the gradient of the temperature-time characteristic of the normal product and that of the malfunction product is remarkable when the temperature increases or decreases.

Accordingly, the controller 14 can reliably detect an abnormality in the detected amount of change ($\Delta T_n$, $\delta T_n/\delta t$) at step S6, if it executes step S6 when the increase or decrease of the temperature T is detected.

As an example, the controller 14 executes step S6 when the consumed power P detected at step S3 has been zero. In this case, the temperature T detected by the temperature detecting part 26 decreases, and therefore the detected amount of change ($\Delta T_n$, $\delta T_n/\delta t$) detected at step S4 is a negative value.

If a malfunction occurs in the heat radiation performance of the heatsink 20 in this case, the difference between the detected amount of change ($\Delta T_n$, $\delta T_n/\delta t$) calculated at step S4 and the reference amount of change $\Delta T_{ref}$ determined at step S5 is remarkable. Therefore, it is possible to reliably detect an abnormality in the detected amount of change ($\Delta T_n$, $\delta T_n/\delta t$) at step S6.

Figure 8:
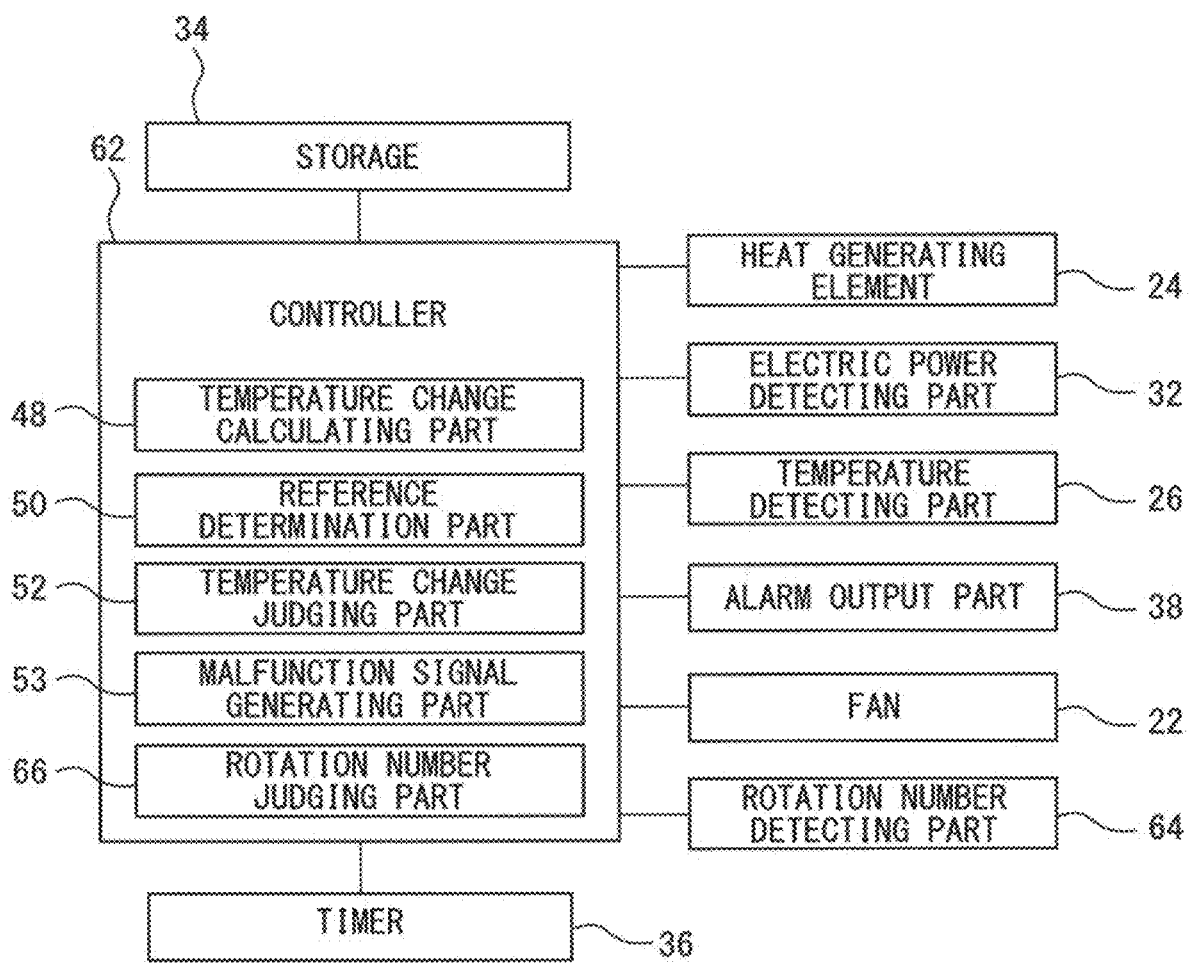
FIG. 8 is a block diagram of a motor driving device according to another embodiment of the invention.

Next, a motor driving device 60 according to another embodiment of the invention will be described with reference to FIG. 8. Note that, in various embodiments described below, elements similar to those in the already-mentioned embodiments are assigned the same reference numerals, and detailed descriptions thereof will be omitted.

The motor driving device 60 includes the housing 12 (FIG. 1), a controller 62, the heatsink assembly 16 (FIG. 2, FIG. 3), the heat generating element 24, the temperature detecting part 26, the electric power detecting part 32, the storage 34, the timer 36, the alarm output part 38, and a rotation number detecting part 64. The heatsink assembly 16 includes the heatsink 20 and the fan 22.

The rotation number detecting part 64 is comprised of e.g. an encoder, and detects the rotation number of the rotator of the fan 22. The rotation number detecting part 64 sends data of the rotation number of the fan 22 to the controller 62.

Next, the operation of the motor driving device 60 will be described with reference to FIG. 9. Note that, in the processing flow shown in FIG. 9, processes similar to those of the processing flow shown in FIG. 7 are assigned the same step numbers, and detailed descriptions thereof will be omitted.

When it is judged "YES" at step S6, at step S21, the controller 62 detects the rotation number of the fan 22. Specifically, the controller 62 sends a command to the rotation number detecting part 64 so as to detect a rotation number $R_n$ of the fan 22. The controller 62 records onto the storage 34 data of the rotation number $R_n$ of the fan 22 received from the rotation number detecting part 64.

At step S22, the controller 62 judges whether the rotation number $R_n$ acquired at step S21 is different from a predetermined reference rotation number $R_{ref}$. For example, the reference rotation number $R_{ref}$ is predetermined as a value required for operating the fan 22 in a regular mode when the motor driving device 60 supplies electric power to the main motor of a machine tool, etc. The storage 34 pre-stores the reference rotation number $R_{ref}$.

As an example, the controller 62 calculates a difference $\delta_2$ ($=|R_n-R_{ref}|$) between the rotation number $R_n$ acquired at step S21 and the reference rotation number $R_{ref}$ stored in the storage 34. Then, the controller 62 judges whether the difference $\delta_2$ exceeds a predetermined threshold value $\alpha_2$. When the difference $\delta_2$ exceeds the threshold value $\alpha_2$ (i.e., $\delta_2 > \alpha_2$), the controller 62 determines that the rotation number $R_n$ is different from the reference rotation number $R_{ref}$.

As another example, the controller 62 judges whether the rotation number $R_n$ acquired at step S21 falls within a predetermined allowable range (e.g., a range of ±5% of the reference rotation number $R_{ref}$). When the rotation number $R_n$ is out of the allowable range, the controller 62 judges that the rotation number $R_n$ is different from the reference rotation number $R_{ref}$.

Thus, in this embodiment, the controller 62 functions as a rotation number judging part 66 (FIG. 8) which judges whether the rotation number $R_n$ of the fan 22 is different from the reference rotation number $R_{ref}$.

When the controller 62 judges that the rotation number $R_n$ is different from the reference rotation number $R_{ref}$ (i.e., judges "YES"), it proceeds to step S24. On the other hand, when the controller 62 judges that the rotation number $R_n$ is not different from the reference rotation number $R_{ref}$ (i.e., judges "NO"), it proceeds to step S23.

At step S23, the controller 62 generates a first malfunction notification signal indicating that a malfunction occurs in the heat radiation performance of the heatsink 20. On the other hand, at step S24, the controller 62 generates a second malfunction notification signal indicating that a malfunction occurs in the operation of the fan 22.

At step S25, the controller 62 transmits the first malfunction notification signal generated at step S23 or the second malfunction notification signal generated at step S24 to the alarm output part 38.

If the alarm output part 38 receives the first malfunction notification signal from the controller 62, it outputs to a user an alarm sound or image representing the occurrence of a malfunction in the heat radiation performance of the heatsink 20. On the other hand, when the alarm output part 38 receives the second malfunction notification signal from the controller 62, it outputs to a user an alarm sound or image representing the occurrence of a malfunction in the operation of the fan 22.

According to this embodiment, it is possible to judge whether the abnormality in the detected amount of change ($\Delta T_n$, $\delta T_n/\delta t$) is caused due to the heatsink 20 or the fan 22, when the abnormality in the detected amount of change is detected at step S6. Therefore, a user can accurately recognize the cause of the malfunction in the heat radiation performance of the heatsink 20.

Figure 10:
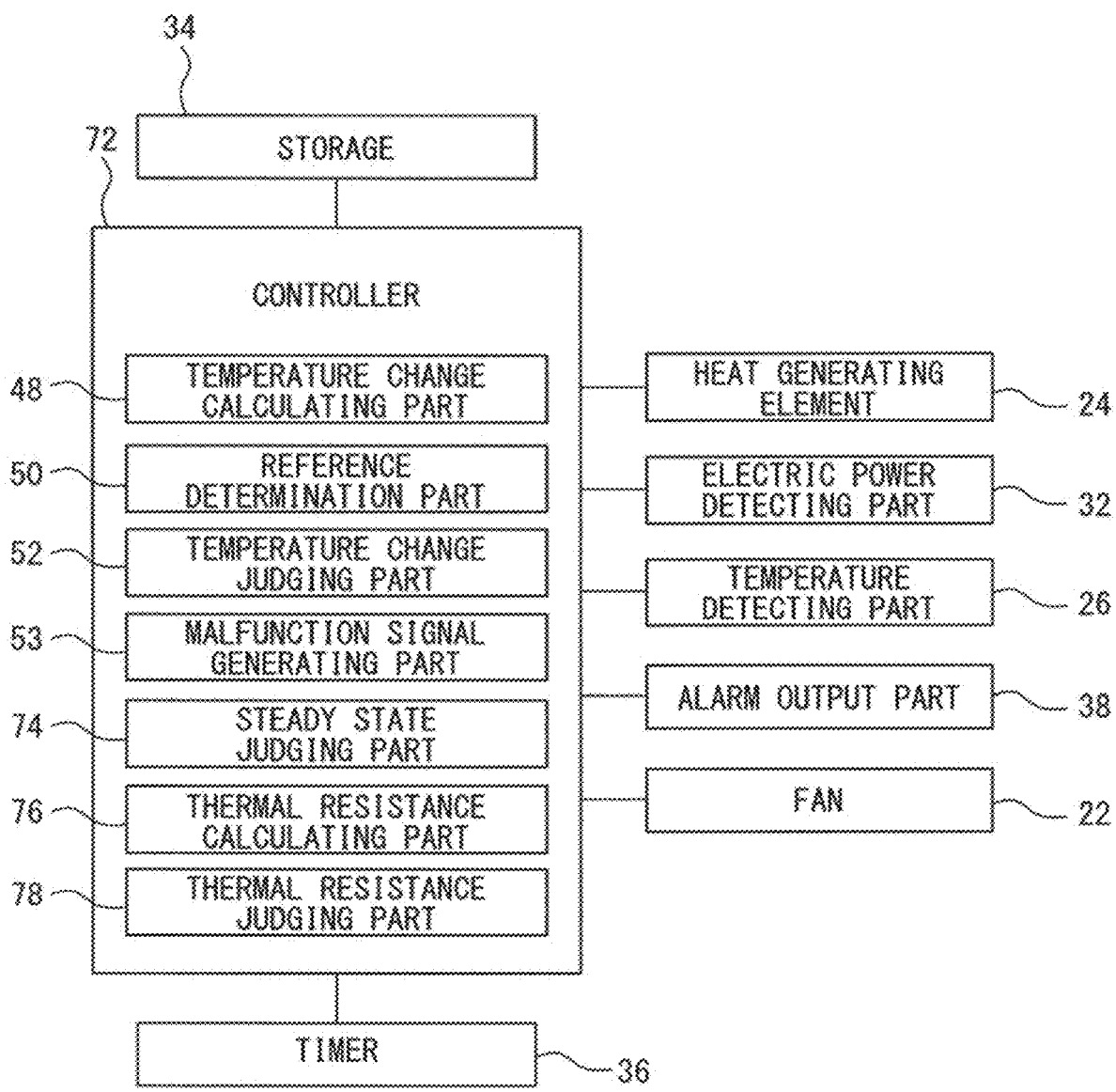
FIG. 10 is a block diagram of a motor driving device according to still another embodiment of the invention.

Next, a motor driving device 70 according to still another embodiment of the invention will be described with reference to FIG. 10. The motor driving device 70 includes the housing 12 (FIG. 1), a controller 72, the heatsink assembly 16 (FIG. 2, FIG. 3), the heat generating element 24, the temperature detecting part 26, the electric power detecting part 32, the storage 34, the timer 36, and the alarm output part 38. The heatsink assembly 16 includes the heatsink 20 and fan 22.

Next, the operation of the motor driving device 70 will be described with reference to FIG. 11. Note that, in the processing flow shown in FIG. 11, processes similar to those of the processing flow shown in FIG. 7 are assigned the same step numbers, and detailed descriptions thereof will be omitted.

As described above with reference to FIG. 5, when constant electric power P is continuously applied to the heat generating element 24, the temperature T gradually shifts to a steady state (i.e., saturated state). When the temperature T is in the steady state, there is no remarkable difference between the gradient of the characteristic of the normal product (solid line 42) and that of the malfunction product (dashed-dotted line 40).

Therefore, in such a steady state, even in a malfunction product, the difference between the detected amount of change ($\Delta T_n$, $\delta T_n/\delta t$) and the reference amount of change $\Delta T_{ref}$ is small, and therefore it is difficult to detect an abnormality in the detected amount of change at step S6.

In order to address this matter, in this embodiment, the controller 72 judges whether a temperature change of the motor driving device 70 is in a steady state, and if the temperature change is in a steady state, the controller 72 detects a malfunction in the heatsink based on the thermal resistance of the motor driving device 70.

Specifically, at step S31, the controller 72 judges whether a temperature change of the motor driving device 70 is in a steady state. As an example, the controller 72 determines that the temperature change of the motor driving device 70 is in a steady state, when the consumed power P acquired at step S3 is substantially constant for a predetermined period of time.

Specifically, the controller 72 determines that the temperature change of the motor driving device 70 is in a steady state, when the variation in the consumed powers $P_{n-m}$ to $P_n$ acquired at each step S3 during the controller 72 repeatedly executes step S7 by "m" times (i.e., a period of $\tau \times m$) falls within a predetermined range (e.g., a range of ±5%).

As another example, the controller 72 may determine that the temperature change of the motor driving device 70 is in a steady state, when the temperature T acquired at step S2 is substantially constant for a predetermined period of time.

Specifically, the controller 72 determines that the temperature change of the motor driving device 70 is in a steady state, when the variation in the temperatures $T_{n-m}$ to $T_n$ acquired at each step S2 during the controller 72 repeatedly executes step S7 by "m" times (i.e., a period of $\tau \times m$) falls within a predetermined range (e.g., a range of ±5%).

Thus, in this embodiment, the controller 72 functions as a steady state judging part 74 (FIG. 10) which judges whether the temperature change of the motor driving device 70 is in a steady state.

When the controller 72 judges that the temperature change of the motor driving device 70 is in a steady state (i.e., judges "YES"), it proceeds to step S32. On the other hand, when the controller 72 judges that the temperature change of the motor driving device 70 is not in a steady state (i.e., judges "NO"), it proceeds to step S4.

At step S32, the controller 72 calculates a thermal resistance of the motor driving device 70. Specifically, the controller 72 calculates a thermal resistance $Z_n$ of the motor driving device 70 by substituting the temperature $T_n$ acquired at step S2 in the n-th loop, a reference temperature $T_0$, and the consumed power $P_n$ acquired at step S3 in the n-th loop into Equation 1 below.

$$Z_n = (T_n - T_0)/P_n \quad \text{(Equation 1)}$$

Note that, the reference temperature $T_0$ may be a temperature measured by the temperature detecting part 26 before electric power is applied to the heat generating element 24. Alternatively, the reference temperature $T_0$ may be an ambient temperature around the motor driving device 10. In this case, another temperature detecting part for measuring the ambient temperature may be provided.

Thus, in this embodiment, the controller 72 functions as a thermal resistance calculating part 76 (FIG. 10) which calculates the thermal resistance of the motor driving device 70.

At step S33, the controller 72 judges whether the thermal resistance $Z_n$ calculated at step S32 is different from a predetermined reference thermal resistance $Z_{ref}$. The reference thermal resistance $Z_{ref}$ is predetermined depending on the temperature T of the motor driving device 70 and the consumed power P of the heat generating element 24, and is pre-stored in the storage 34. The reference thermal resistance $Z_{ref}$ can be obtained by a theoretical, experimental, or simulation method.

As an example, the controller 72 calculates a difference $\delta_3$ ($=|Z_n - Z_{ref}|$) between the thermal resistance $Z_n$ calculated at step S32 and the reference thermal resistance $Z_{ref}$. Then, the controller 72 judges whether the difference $\delta_3$ exceeds a predetermined threshold value $\alpha_3$. When the difference $\delta_3$ exceeds the threshold value $\alpha_3$ (i.e., $\delta_3 > 3$), the controller 62 judges that the thermal resistance $Z_n$ is different from the reference thermal resistance $Z_{ref}$.

As another example, the controller 72 judges whether the thermal resistance $Z_n$ calculated at step S32 falls within a predetermined allowable range (e.g., a range of ±5% of the reference thermal resistance $Z_{ref}$). When the thermal resistance $Z_n$ is out of the allowable range, the controller 72 judges that the thermal resistance $Z_n$ is different from the reference thermal resistance $Z_{ref}$.

Thus, in this embodiment, the controller 72 functions as a thermal resistance judging part 78 (FIG. 10) which judges whether the thermal resistance $Z_n$ calculated at step S32 is different from the reference thermal resistance $Z_{ref}$.

When the controller 72 judges that the thermal resistance $Z_n$ is different from the reference thermal resistance $Z_{ref}$ (i.e., judges "YES"), it proceeds to step S10. On the other hand, when the controller 72 judges that the thermal resistance $Z_n$ is not different from the reference thermal resistance $Z_{ref}$ (i.e., judges "NO"), it proceeds to step S7.

According to this embodiment, it is possible to detect a malfunction in the heat radiation performance of the heatsink 20, both when the temperature of the motor driving device 70 varies in a short period of time and when the temperature of the motor driving device 70 is in a steady state. Due to this, it is possible to reliably detect a malfunction in the heat radiation performance of the heatsink 20 even if the motor driving device 70 is operated in various operation modes.

Note that, the heatsink 20 may have any shape. For example, the heatsink may be configured to have a polygonal or circular outer shape.

Further, the heat generating element 24 may be indirectly attached to the heatsink 20 via another member made of e.g. a heat conducting material. Alternatively, the heat generating element 24 may be attached to any element other than the heatsink 20, which is a component of the motor driving device 10, 60, 70.

Further, the fan 22 may be omitted. In this case, the heatsink 20 naturally air-cools the motor driving device. Even in such a case, foreign substances may adhere to the surface of the heatsink 20, thereby the heat radiation performance of the heatsink 20 may be reduced. According the invention, such a malfunction in the heatsink 20 can be detected.

Further, when the controller 14, 62, 72 judges "YES" at step S6, it may execute step S9 without carrying out steps S10 and S11. Further, when the controller 14, 62, 72 judges "YES" at step S6, it may omit step S9 after executing steps S10 and S11.

Further, the features of the above-mentioned various embodiments can be combined. For example, steps S21 to S24 in FIG. 9 can be incorporated in the processing flow in FIG. 7 or 11.

Figure 9:
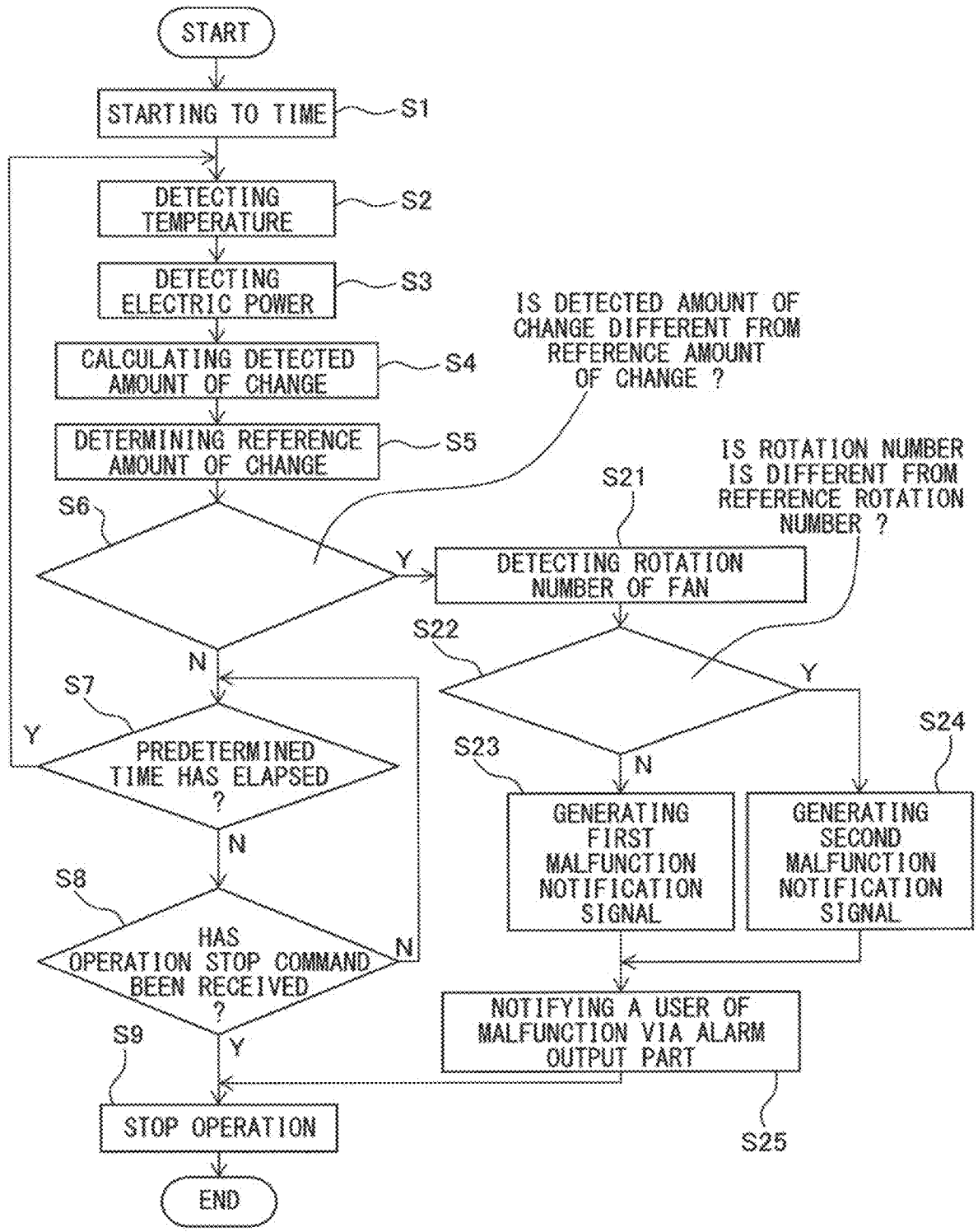
FIG. 9 is a flowchart showing an example of a processing flow of the motor driving device shown in FIG. 8.
Figure 11:
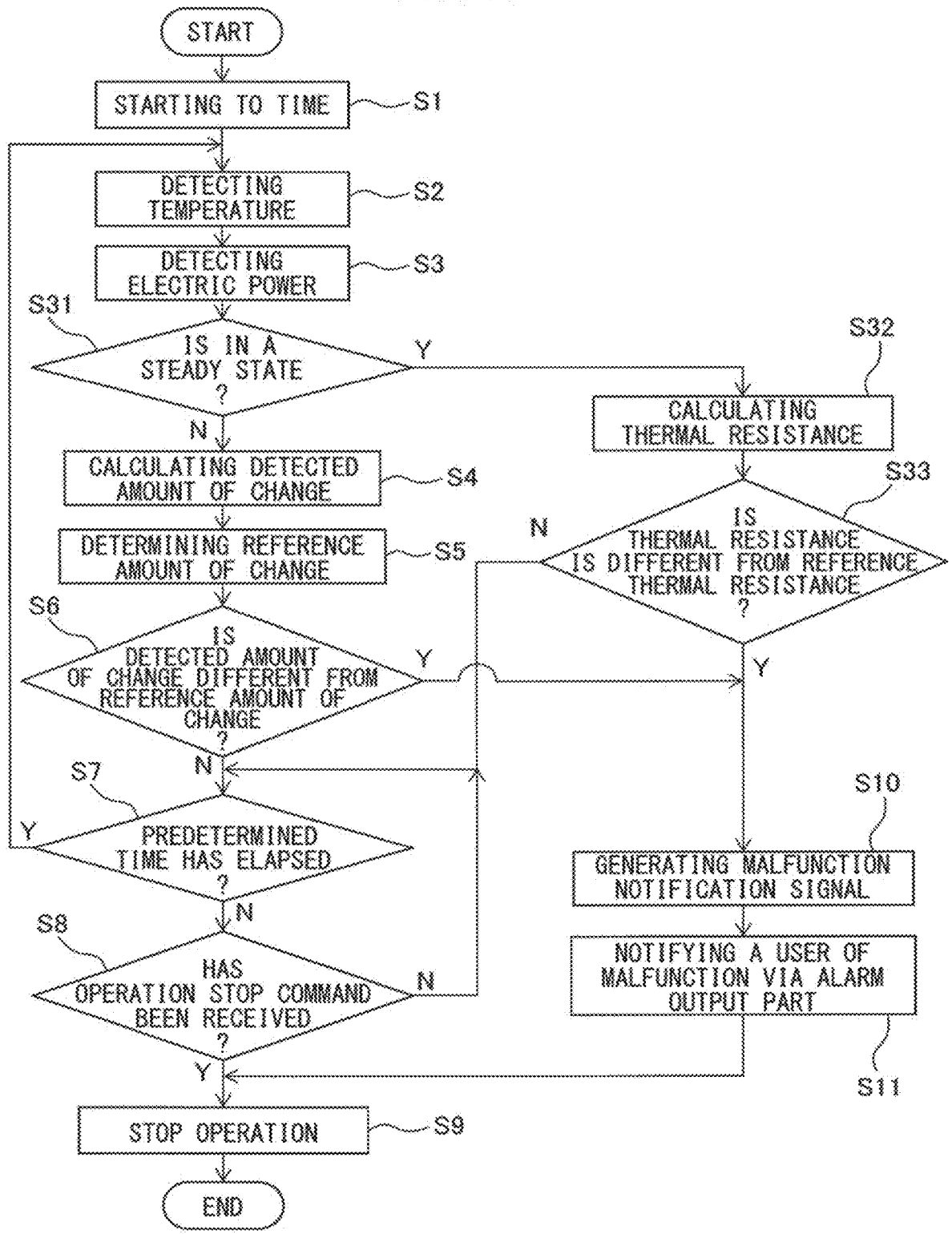
FIG. 11 is a flowchart showing an example of a processing flow of the motor driving device shown in FIG. 10.

If steps S21 to S24 in FIG. 9 are incorporated in the processing in FIG. 11, these steps S21 to S24 in FIG. 9 can be executed after steps S6 and S33 in FIG. 11.

Although the invention has been described above through various embodiments, the embodiments do not limit the inventions according to the claims. Further, a configuration obtained by combining the features described in the embodiments of the invention can be included in the technical scope of the invention. However, all combinations of these features are not necessarily essential for means for solving the invention. Furthermore, it is obvious for a person skilled in the art that various modifications or improvements can be applied to the embodiments.

Regarding the order of operations, such as actions, sequences, steps, processes, and stages, in the devices, systems, programs, and methods indicated in the claims, specification and drawings, it should be noted that the terms "before", "prior to", etc. are not explicitly described, and any order can be realized unless the output of a previous operation is used in the subsequent operation. Regarding the processing in the claims, specification, and drawings, even when the order of operations is described using the terms "first", "next", "subsequently", "then", etc., for convenience, maintaining this order is not necessarily essential for working the inventions.

The invention claimed is:

1. A motor driving device comprising:
a heat generating element;
a heatsink configured to cool the heat generating element;
an electric power detecting part configured to detect a consumed power of the heat generating element;
a temperature detecting part configured to detect a temperature of the motor driving device;
a steady state judging part configured to judge whether a temperature of the motor driving device is in a saturated state based on the consumed power detected by the electric power detecting part or on the temperature detected by the temperature detecting part;
a temperature change calculating part configured to, only when the steady state judging part judges that the temperature of the motor driving device is not in the saturated state, calculate an amount of change in the temperature within a predetermined time as a detected amount of change, based on the temperature detected by the temperature detecting part;
a reference determination part configured to determine a reference amount of change in the temperature, based on the temperature detected by the temperature detecting part and on the consumed power detected by the electric power detecting part; and
a temperature change judging part configured to compare the reference amount of change determined by the reference determination part with the detected amount of change calculated by the temperature change calculating part, and judges whether the detected amount of change is different from the reference amount of change.

2. The motor driving device according to claim 1, wherein the steady state judging part judges that the temperature change of the motor driving device is in a steady state when the consumed power is constant for a predetermined period of time.

3. The motor driving device according to claim 1, further comprising:
a thermal resistance calculating part configured to calculate a thermal resistance of the motor driving device based on the consumed power and the temperature detected by the temperature detecting part when the steady state judging part judges that the temperature of the motor driving device is in a saturated state; and
a thermal resistance judging part configured to judge whether the thermal resistance calculated by the thermal resistance calculating part is different from a predetermined reference thermal resistance.

* * * * *